United States Patent
Kim et al.

(10) Patent No.: US 10,910,596 B2
(45) Date of Patent: Feb. 2, 2021

(54) METHOD OF MANUFACTURING A DISPLAY DEVICE BY LASER CUTTING AN AREA OF A DISPLAY PANEL

(71) Applicant: Samsung Display Co., Ltd., Yongin-si (KR)

(72) Inventors: Jinhyeong Kim, Asan-si (KR); Kuhyun Kang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 49 days.

(21) Appl. No.: 16/439,625

(22) Filed: Jun. 12, 2019

(65) Prior Publication Data
US 2020/0083477 A1    Mar. 12, 2020

(30) Foreign Application Priority Data
Sep. 10, 2018   (KR) .......................... 10-2018-0107521

(51) Int. Cl.
| H01L 51/52 | (2006.01) |
| H01L 51/00 | (2006.01) |
| H01L 51/56 | (2006.01) |
| B23K 26/38 | (2014.01) |
| B23K 26/364 | (2014.01) |

(52) U.S. Cl.
CPC ........ *H01L 51/5253* (2013.01); *B23K 26/364* (2015.10); *B23K 26/38* (2013.01); *H01L 51/003* (2013.01); *H01L 51/0096* (2013.01); *H01L 51/5203* (2013.01); *H01L 51/56* (2013.01); *H01L 2251/566* (2013.01)

(58) Field of Classification Search
CPC . H01L 51/56; H01L 51/003; H01L 2251/566; H01L 2227/323; H01L 2227/326; H01L 51/5253; H01L 51/5203; H01L 51/0096–0097; H01L 51/5293; H01L 51/5281; H01L 21/683; B23K 26/38; B23K 26/364
See application file for complete search history.

(56) References Cited

U.S. PATENT DOCUMENTS

| 8,841,150 B2 * | 9/2014 | Kim ........................ H01L 27/15 438/33 |
| 9,991,287 B2 | 6/2018 | Lim et al. |
| 10,128,461 B2 | 11/2018 | Kang et al. |

(Continued)

FOREIGN PATENT DOCUMENTS

| KR | 10-2015-0045076 A | 4/2015 |
| KR | 10-2017-0019553 A | 2/2017 |

(Continued)

*Primary Examiner* — Younes Boulghassoul
(74) *Attorney, Agent, or Firm* — Lewis Roca Rothgerber Christie LLP

(57) ABSTRACT

In a method for manufacturing a display device, the method includes: providing a display panel divided into a cutting area and a body part surrounding the cutting area; attaching a dummy film on a bottom surface of the display panel; cutting the cutting area by irradiating laser light toward a cutting line defined as a boundary between the cutting area and the body part; irradiating the laser light to a groove line of the dummy film, which overlaps the cutting line, to define a groove in the dummy film along the groove line; and separating the dummy film from the body part.

20 Claims, 11 Drawing Sheets

(56) References Cited

U.S. PATENT DOCUMENTS

| | | | |
|---|---|---|---|
| 10,205,122 B2 | 2/2019 | Choi et al. | |
| 2015/0072454 A1* | 3/2015 | Kim | H01L 27/1266 438/28 |
| 2017/0210115 A1* | 7/2017 | Ohno | B32B 43/006 |
| 2018/0047609 A1* | 2/2018 | Ohno | H01L 21/7806 |
| 2018/0102509 A1* | 4/2018 | Kim | H01L 21/67092 |
| 2018/0159086 A1 | 6/2018 | Cho | |
| 2018/0159087 A1* | 6/2018 | Yug | H01L 27/323 |
| 2019/0036024 A1* | 1/2019 | Bai | H01L 51/0097 |
| 2019/0165272 A1* | 5/2019 | Kang | H01L 51/003 |

FOREIGN PATENT DOCUMENTS

| | | |
|---|---|---|
| KR | 10-2017-0059864 A | 5/2017 |
| KR | 10-2017-0126535 A | 11/2017 |
| KR | 10-2018-0063418 A | 6/2018 |

\* cited by examiner

METHOD OF MANUFACTURING A DISPLAY DEVICE BY LASER CUTTING AN AREA OF A DISPLAY PANEL

CROSS-REFERENCE TO RELATED APPLICATION

This application claims priority to and the benefit of Korean Patent Application No. 10-2018-0107521, filed on Sep. 10, 2018, the entire content of which is hereby incorporated by reference.

BACKGROUND

Aspects of some example embodiments of the present disclosure herein relate to a method for manufacturing a display device.

In general, an electronic apparatus such as a smartphone, a digital camera, a notebook computer, a navigation device, or a smart television that provides an image to a user includes a display device for displaying the image. The display device generates an image and provides the generated image to the user through a display screen.

The display device includes a display panel for generating an image and functional elements for providing various functions to the user. The functional elements may include, for example, a speaker, a camera, or functional buttons, etc. In the display panel, a plurality of holes may be formed to position the functional elements therein, and the function elements may be exposed externally through the holes. When the display device is manufactured, cutting areas of the display panel may be removed to provide the holes.

Each of the cutting areas may be defined as a closed curve, and laser light may be irradiated to the closed curve to cut the cutting area. A starting point and an end point of the closed curve to which the laser light is irradiated may be identical. The laser light is irradiated from a first point of the closed curve, moves along the closed curve, and then moves again to the first point.

However, when the laser light is irradiated from the first point and moves to a portion adjacent to the first point again, a portion of the cutting area, which is cut earlier, may sag due to gravity. In this case, the first cutting area may not be accurately cut.

The above information disclosed in this Background section is only for enhancement of understanding of the background and therefore it may contain information that does not constitute prior art.

SUMMARY

The present disclosure provides a method for manufacturing a display device which may be capable of improving a yield ratio of the display device.

According to some example embodiments of the inventive concept, in a method for manufacturing a display device, the method includes: providing a display panel divided into a cutting area and a body part surrounding the cutting area; attaching a dummy film on a bottom surface of the display panel; cutting the cutting area by irradiating laser light toward a cutting line defined as a boundary between the cutting area and the body part; irradiating the laser light to a groove line of the dummy film, which overlaps the cutting line, to define a groove in the dummy film along the groove line; and separating the dummy film from the body part.

According to some example embodiments of the inventive concept, in a method for manufacturing a display device, the method includes: providing a display panel divided into a cutting area and a body part surrounding the cutting area; positioning a polarization film divided into a sub cutting area overlapping the cutting area and a sub body part surrounding the sub cutting area under the display panel; attaching a dummy film on a bottom surface of the polarization film; cutting the cutting area and the sub cutting area by irradiating, above the display panel, laser light toward a cutting line defined as a boundary between the cutting area and the body part; irradiating the laser light to a groove line of the dummy film, which overlaps the cutting line, to define a groove in the dummy film along the groove line; and separating the dummy film from the sub body part.

BRIEF DESCRIPTION OF THE FIGURES

The accompanying drawings are included to enable further understanding of aspects of some example embodiments of the inventive concept, and are incorporated in and constitute a part of this specification. The drawings illustrate example embodiments of the inventive concept and, together with the description, serve to explain principles of the inventive concept. In the drawings.

DETAILED DESCRIPTION

Figure 1:
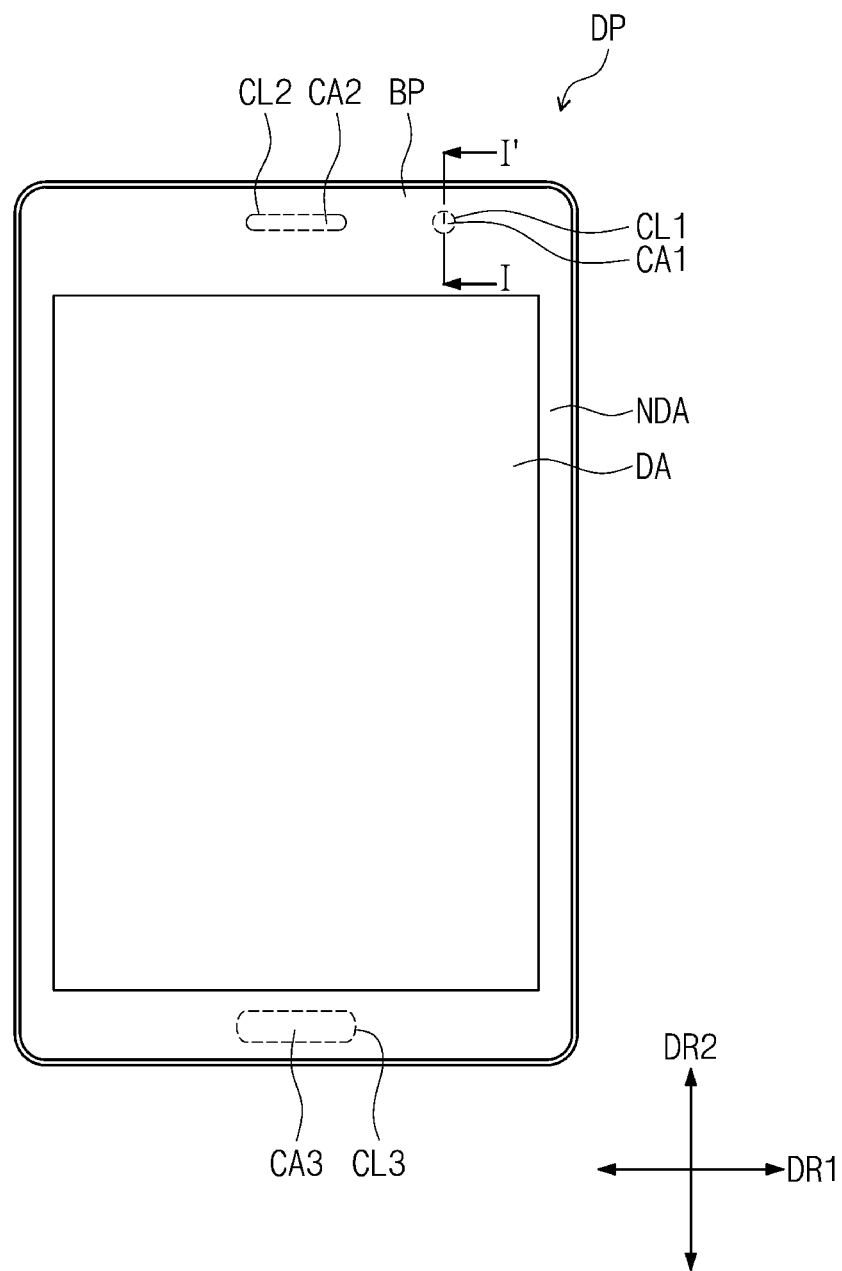
FIG. 1 is a plan view of a display panel used in a method for manufacturing a display device according to some example embodiments of the inventive concept.

It will be understood that when an element or layer is referred to as being "on", "connected to" or "coupled to" another element or layer, it can be directly on, connected or coupled to the other element or intervening third elements may be present.

Like reference numerals in the drawings refer to like elements. In addition, in the drawings, the thickness and the ratio and the dimension of the element are exaggerated for effective description of the technical contents.

The term "and/or" includes any and all combinations of one or more of the associated items.

Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the present invention. The singular forms "a," "an" and "the" are intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Hereinafter, embodiments of the present invention will be described in detail with reference to the accompanying drawings.

FIG. 1 is a plan view of a display panel used in a method for manufacturing a display device according to some example embodiments of the inventive concept.

Referring to FIG. 1, a display panel DP may have a rectangular shape having short sides in a first direction DR1 and long sides in a second direction DR2 intersecting with (e.g., perpendicular with respect to) the first direction DR1. The edges of the display panel DP may have a round shape. A polarization film may be positioned on the display panel DP, and the polarization film is illustrated, for example, in FIG. 2.

The display panel DP may be an organic light emitting display panel. However, embodiments of the inventive concept are not limited thereto, and various image display panels such as liquid crystal display panels, electrowetting display panels, and electrophoresis display panels, etc., which can display images, may be used as the display panel DP.

The display panel DP may have a plane defined by the first and second directions DR1 and DR2. The plane area of the display panel DP may include a display area DA on which an image is displayed and a non-display area NDA surrounding the display area DA.

The display panel DP may be divided into a plurality of cutting areas CA1, CA2, and CA3, and a body part BP surrounding the cutting areas CA1, CA2, and CA3. Boundaries between the cutting areas CA1, CA2, and CA3 and the body part BP may be defined as cutting lines CL1, CL2, and CL3, respectively.

The cutting areas CA1, CA2, and CA3 are parts to be removed when the display device is manufactured, and the body part BP may be a part that will remain. Three example cutting areas CA1, CA2, and CA3 are illustrated, but the number of the cutting areas CA1, CA2, and CA3 is not limited thereto to the number illustrated in FIG. 1, and various embodiments may include additional or fewer cutting areas.

The cutting areas CA1, CA2, and CA3 may be positioned in the non-display area NDA. The body part BP may be a part of the display panel DP excluding the cutting areas CA1, CA2, and CA3. For example, the body part BP may include the display area DA and a part of the non-display area NDA excluding the cutting areas CA1, CA2, and CA3.

The cutting areas CA1, CA2, and CA3 may include a first cutting area CA1, a second cutting area CA2, and a third cutting area CA3. The cutting lines CL1, CL2, and CL3 may include a first cutting line CL1 that is the boundary between the first cutting area CA1 and the body part BP, a second cutting line CL2 that is the boundary between the second cutting area CA2 and the body part BP, and a third cutting line CL3 that is the boundary between the third cutting area CA3 and the body part BP.

Each of cutting areas CA1, CA2, and CA3 may be defined, for example, by a simple closed curve. The simple closed curve may be defined by a closed figure such as a polygon, a circle, or an ellipse, of which a start point and an end point are the same, when a point is marked on a straight line or a curve.

A laser light may be irradiated to the first, second, and third cutting lines CL1, CL2, and CL3 to cut the first, second, and third cutting areas CA1, CA2, and CA3, respectively. Such a manufacturing process will be described in more detail below. Functional elements may be positioned in holes of the display panel, which are defined by removing the first, second, and third cutting areas CA1, CA2, and CA3.

Figure 2:
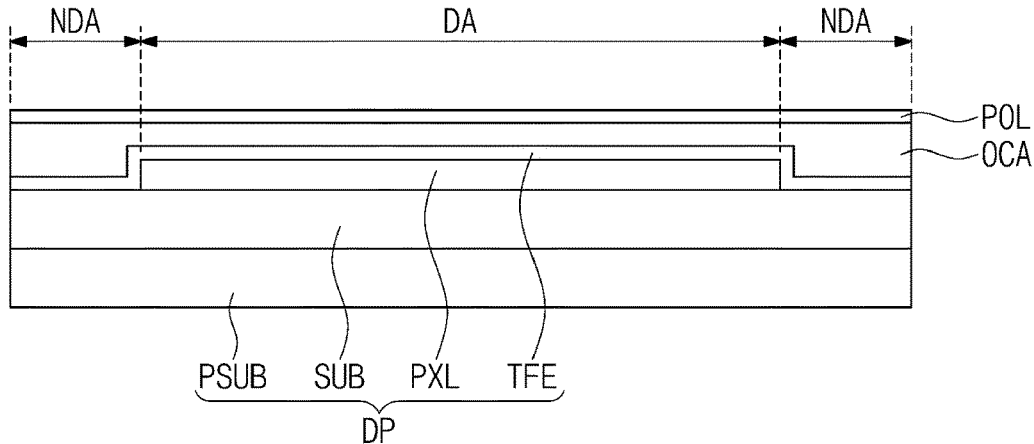
FIG. 2 schematically shows a cross section of the display panel shown in FIG. 1.

FIG. 2 shows a cross section of the display panel shown in FIG. 1.

Referring to FIG. 2, the display panel DP may include a substrate SUB, a pixel layer PXL positioned on the substrate SUB, a thin film encapsulation layer TFE positioned on the substrate SUB to cover the pixel layer PXL, and a protection substrate PSUB positioned under the substrate SUB.

The substrate SUB may include polyimide as a plastic material having flexibility. The protection substrate PSUB may include polyimide or polyethylene terephthalate as a plastic material having flexibility.

The bottom surface of the protection substrate PSUB may define the bottom surface of the display panel DP. The protection substrate PSUB may be omitted. When the protection substrate PSUB is omitted, the bottom surface of the substrate SUB may define the bottom surface of the display panel DP.

The substrate SUB may include a display area DA and a non-display area surrounding the display area DA. The pixel layer PXL may be positioned on the display area DA. The pixel layer PXL may include a plurality of pixels, and each of the pixels may include a light emitting element.

The thin film encapsulation layer TFE may include at least two inorganic layers and an organic layer positioned therebetween. The inorganic layers may include an inorganic material and protect the pixel layer PXL from moisture/oxygen. The organic layer may include an organic material and protect the pixel layer PXL from foreign material or contaminants such dust particles, moisture, and the like.

An example of the thin-film encapsulation layer TFE is illustrated to protect the pixel layer PXL, but embodiments of the inventive concept are not limited thereto. In order to protect the pixel layer PXL, an encapsulation substrate (e.g. Encap Glass) may be used. When the encapsulation substrate is used, the substrate SUB may include a glass substrate so as to produce a rigid product.

The encapsulation substrate may be positioned on the substrate SUB, and the pixel layer PXL may be positioned between the encapsulation substrate and the substrate SUB. The encapsulation substrate may be attached to the substrate SUB through a sealing member positioned on the non-display area NDA of the substrate SUB.

The encapsulation substrate may include a synthetic resin substrate or a glass substrate. The sealing member may include an inorganic adhesion member such as frit. However, the sealing member is not limited thereto and may include an organic adhesion member. The pixel layer PXL may be encapsulated from the outside through the encapsulation substrate and the sealing member, and thus incidences of defects in light emitting elements from moisture may be prevented or reduced.

The polarization film POL may be positioned on the display panel DP. The polarization film POL may be adhered to the display panel DP by an adhesive OCA. The adhesive OCA may include an optical clear adhesive. The polarization film POL may be defined as an anti-reflection film.

The polarization film POL may reduce a reflection ratio of external light incident toward the display panel DP above the display panel DP. For example, the polarization film POL may include a retarder and a polarizer. The polarization film POL may be omitted.

Figure 3:
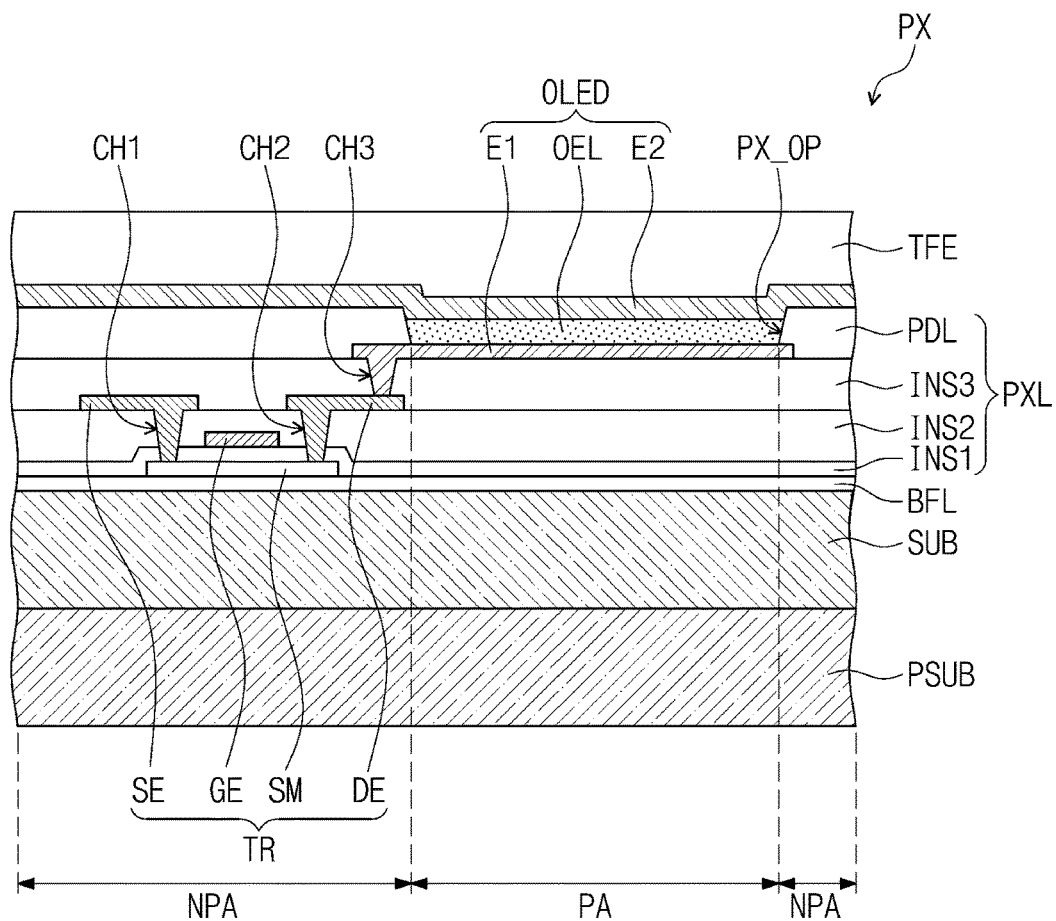
FIG. 3 shows a cross section configuration of any one pixel in a pixel layer illustrated in FIG. 2.

FIG. 3 shows a cross section configuration of any one pixel positioned in a pixel layer illustrated in FIG. 2.

Referring to FIG. 3, the pixel PX may include a light emitting element OLED, and a transistor TR connected to the light emitting element OLED. The light emitting element OLED may include an organic light emitting diode. The transistor TR and the light emitting element OLED may be positioned on the substrate SUB. The layer in which the transistor TR and the light emitting element OLED are positioned may be defined as the pixel layer PXL.

The protection substrate PSUB is positioned under the substrate SUB, and a buffer layer BFL may be positioned on the substrate SUB. The buffer layer BFL may include an inorganic material. The buffer layer BFL may be omitted.

A semiconductor layer SM of the transistor TR may be positioned on the buffer layer BFL. The semiconductor layer SM may include a semiconductor of an inorganic material such as amorphous silicon or poly silicon, or an organic semiconductor. In addition, the semiconductor layer SM may include oxide semiconductor. Although not shown in FIG. 3, the semiconductor layer SM may include a source area, a drain area, and a channel area between the source area and the drain area.

A first insulation layer INSI may be positioned on the buffer layer BFL so as to cover the semiconductor layer SM. The first insulation layer INS1 may include an inorganic material. A gate electrode GE of the transistor TR, which overlaps the semiconductor layer SM, may be positioned on the first insulation layer INS1. The gate electrode GE may be positioned to overlap the channel area of the semiconductor layer SM.

A second insulation layer INS2 may be positioned on the first insulation layer INS1 so as to cover the gate electrode GE. The second insulation layer INS2 may be defined as an interlayer insulation layer. The second insulation layer INS2 may include an organic material and/or inorganic material.

A source electrode SE and a drain electrode DE of the transistor TR may be separately positioned on the second insulation layer INS2. The source electrode SE may be connected to the source area of the semiconductor layer SM through a first contact hole CH1 defined by penetrating through the first insulation layer INS1 and the second insulation layer INS2. The drain electrode DE may be connected to the drain area of the semiconductor layer SM through a second contact hole CH2 defined by penetrating through the first insulation layer INS1 and the second insulation layer INS2.

A third insulation layer INS3 may be positioned on the second insulation layer INS2 so as to cover the source electrode SE and the drain electrode DE of the transistor TR. The third insulation layer INS3 may be defined as a planarization layer configured to provide a flat top surface, and may include an organic material.

A first electrode E1 of the light emitting element OLED may be positioned on the third insulation layer INS3. The first electrode E1 may be connected to the drain electrode DE of the transistor TR through a third contact hole CH3 defined by penetrating the third insulation layer INS3. The first electrode E1 may be defined as a pixel electrode or an anode electrode.

A pixel definition layer configured to expose a prescribed part of the first electrode E1 may be positioned on the first electrode E1 and the third insulation layer INS3. In the pixel definition layer PDL, a pixel open part PX_OP may be defined for exposing a prescribed part of the first electrode E1, and an area in which the pixel open part PX-OP is positioned may be defined as a pixel area PA. The periphery of the pixel area may be defined as a non-pixel area NPA.

In the pixel open part PX-OP, an organic light emitting layer OEL may be positioned on the first electrode E1. The organic light emitting layer OEL may include an organic material that may generate light of any one of red, green, and blue colors. The organic light emitting layer OEL may generate light of any one of red, green, and blue colors. However, the embodiment of the inventive concept is not limited thereto, and the organic light emitting layer OEL may generate white light by combining organic materials for generating red, green, and blue light, respectively.

A second electrode E2 may be positioned on the pixel definition layer PDL and the organic light emitting layer OEL. The second electrode E2 may be defined as a common electrode or a cathode electrode. The display panel DP may be a top emission type, and in this case, the first electrode E1 may include a reflective electrode and the second electrode E2 may be a transparent electrode.

The light emitting electrode OLED may be provided in the pixel area PA and include the first electrode E1, the organic light emitting layer OEL, and the second electrode E2. The first electrode E1 may be an anode that is a hole injecting electrode, and the second electrode E2 may be a cathode that is an electron injecting electrode.

The thin film encapsulation layer TFE may be positioned on the light emitting element OLED to cover the pixel PX. For example, the thin film encapsulation layer TFE may be positioned on the second electrode E2.

A first voltage for allowing the organic light emitting layer OEL to emit light by means of the transistor TR may be applied to the first electrode E1. A second voltage having the opposite polarity of the first voltage may be applied to the second electrode E1.

The hole and electron injected to the organic light emitting layer OEL are combined to provide an exciton, and the light emitting element OLED may emit light while the exciton is transitioned to a ground state. The light emitting element OLED may emit red, green, and blue light according to a flow of a current to display prescribed image information.

FIGS. 4 to 10 are drawings for explaining a method for manufacturing a display device according to some example embodiments of the inventive concept. For example, FIGS. 4 to 9 show cross-sectional views corresponding to the line I-I' shown in FIG. 1. Accordingly, FIGS. 4 to 9 show a process for removing the first cutting area CA1. For convenience of description, FIGS. 4 to 9 do not show lower layer configurations of the display panel DP, and the adhesive OCA configured to bond the display panel DP and the polarization film is omitted.

According to some example embodiments, the second and third cutting areas CA2 and CA3 may also be removed according to processes shown in FIGS. 4 to 9. Accordingly, the process for removing the first cutting area CA1 will be described in more detail below, and processes for removing the second and third cutting areas CA2 and CA3 will be omitted for brevity.

Figure 4:
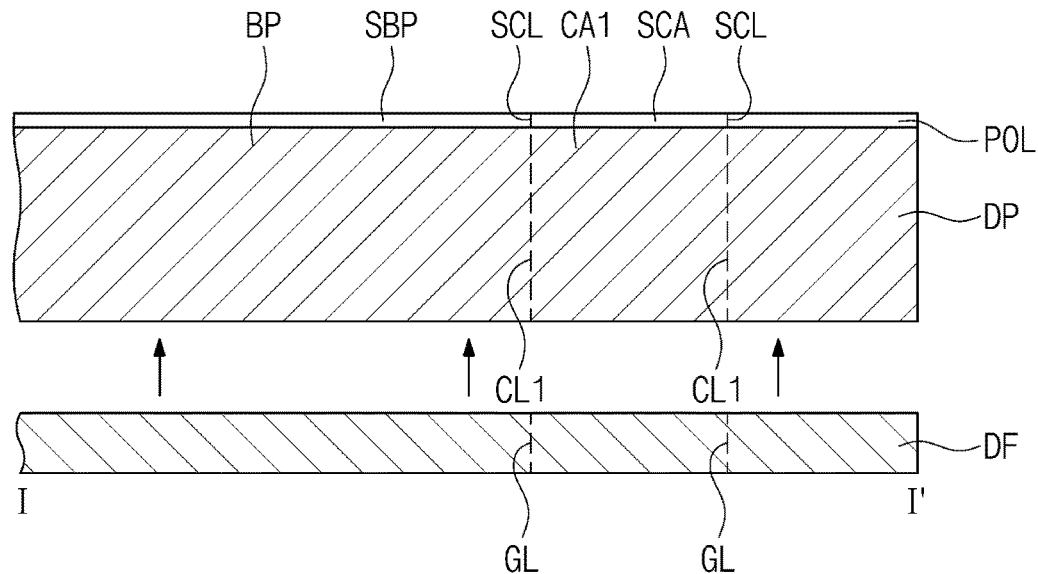
FIGS. 4 to 10 are drawings for explaining a method for manufacturing a display device according to some example embodiments of the inventive concept.

Referring to FIG. 4, the polarization film POL positioned on the display panel DP may be divided into a sub cutting area SCA and a sub body part SBP surrounding the sub cutting area SCA. The sub cutting area SCA overlaps the first cutting area CA1, and the sub body part SBP may overlap the body part BP.

The boundary between the sub cutting area SCA and the sub body part SBP may be defined as a sub cutting line SCL. The sub cutting line SCL may overlap the first cutting line CL1.

A dummy film DF may be attached to the bottom surface of the display panel DP. For example, the dummy film may be attached to the bottom surface of the protection substrate PSUB configured to define the bottom surface of the display panel DP. According to some example embodiments, the dummy film DF may be attached to the bottom surface of the display panel DP by a pressure sensitive adhesive.

In the dummy film DF, a groove line GL configured to overlap the first cutting line CL1 may be defined. The dummy film DF may include polyimide or polyethylene terephthalate as a plastic material.

Figure 5:
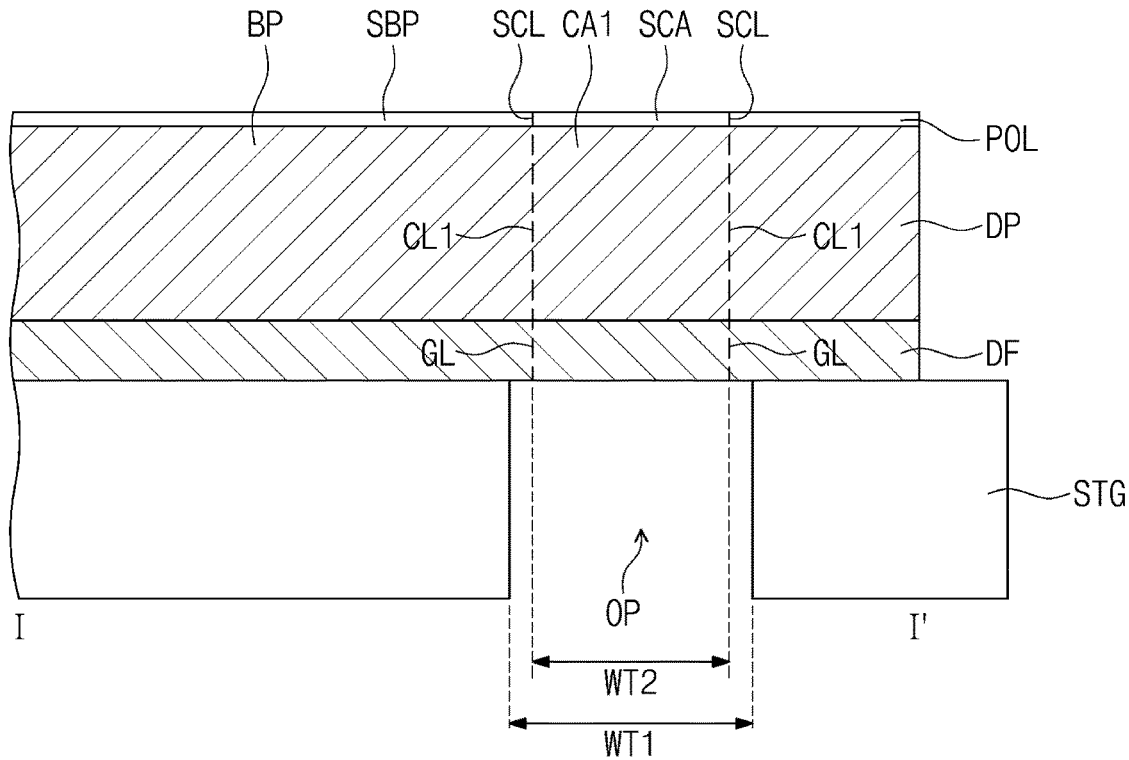

Referring to FIG. 5, the dummy film DF, the display panel DP, and the polarization film POL may be positioned on a stage STG. The dummy film DF may be safely positioned on the stage STG.

In the stage, an opening part OP may be defined, and the opening part OP may overlap the first cutting area CA1. Because the opening part OP is positioned under the first cutting area CA1, the stage STG may not support the first cutting area CA1, but may play a role of supporting the body part BP. The opening part OP may larger than the first cutting area CA1. For example, the first width WT1 of the opening part OP may be larger than the second width WT2 of the first cutting area CA1.

The reason why the opening part OP is defined in the stage STG will be described in more detail in comparison with a stage STG' with respect to FIG. 17 below.

Figure 6:
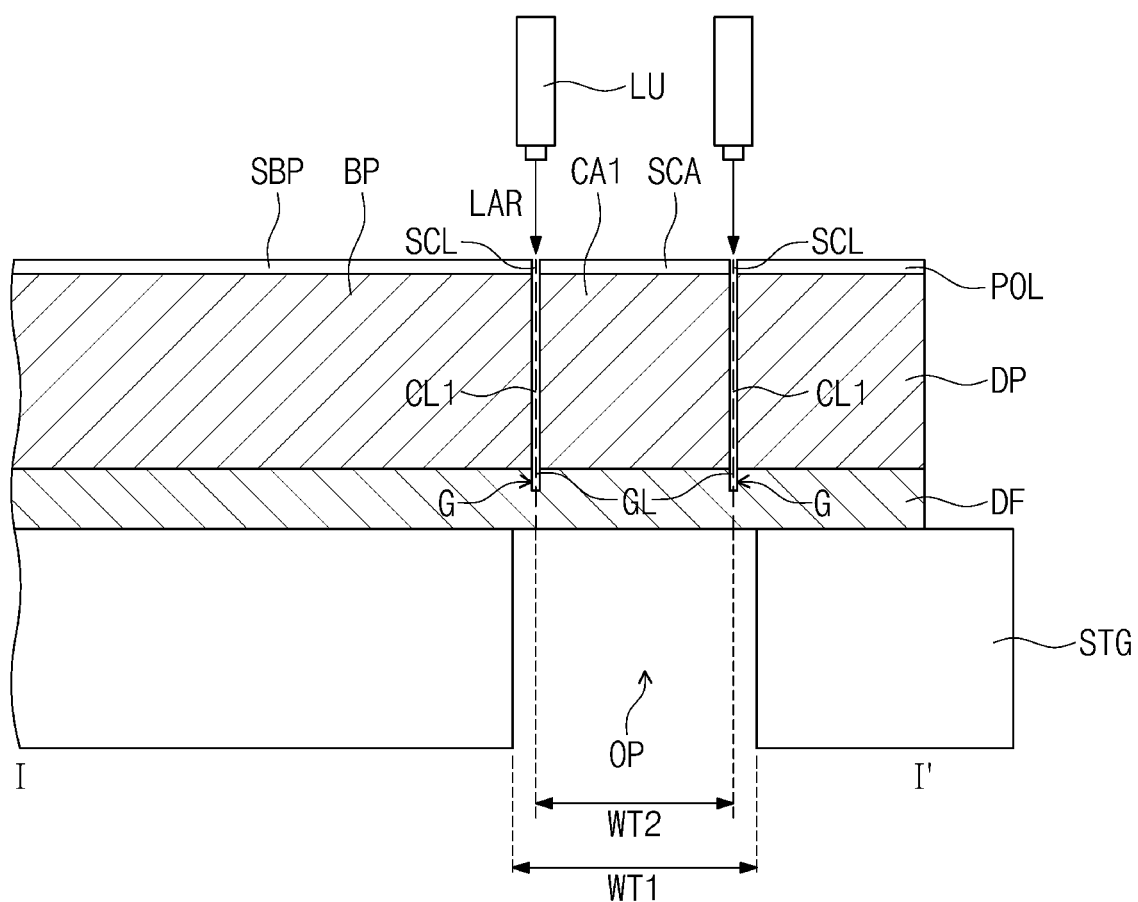

Referring to FIG. 6, a laser unit LU is positioned above the polarization film POL, and the laser unit LU may irradiate laser light LAR toward the polarization film and the display panel DP. The laser light LAR may be irradiated toward the sub cutting line SCL and the first cutting line CL1 from above the display panel DP.

The laser light LAR may be irradiated along the sub cutting line SCL and the first cutting line CL1 while being moved in a clockwise or counterclockwise direction. A starting point and an ending point at which the laser light LAR is irradiated may be the same. The laser light LAR may be irradiated along the sub cutting line SCL and the first cutting line CL1 to cut the sub cutting area SCA and the first cutting area CA1.

After the sub cutting area SCA and the first cutting area CA1 are cut, the laser light LAR may be irradiated to the groove line GL of the dummy film DF. The laser light LAR may be irradiated along the groove ling GL to define a groove G in the dummy film DF along the groove line GL.

The laser light LAR may remove a portion (e.g., a predetermined or prescribed part) of the dummy film DF along the groove line GL without cutting the dummy film DF. As a result, the groove dented from the top surface toward a bottom part of the dummy film may be defined along the groove line GL.

Figure 7:
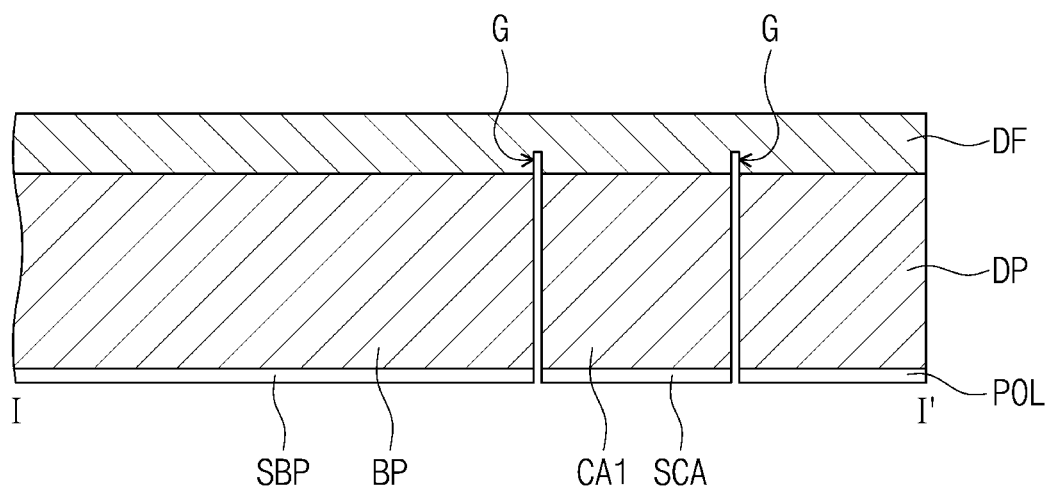

Referring to FIG. 7, after the dummy film DF safely positioned on the stage STG is separated from the stage STG, the polarization film POL, the display panel DP, and the dummy film DF may be reversed. For convenience of description, the stage STG is not illustrated in FIG. 7. The display panel DP is positioned under the dummy film DF, and the polarization film POL may be positioned under the display panel DP.

Figure 8:
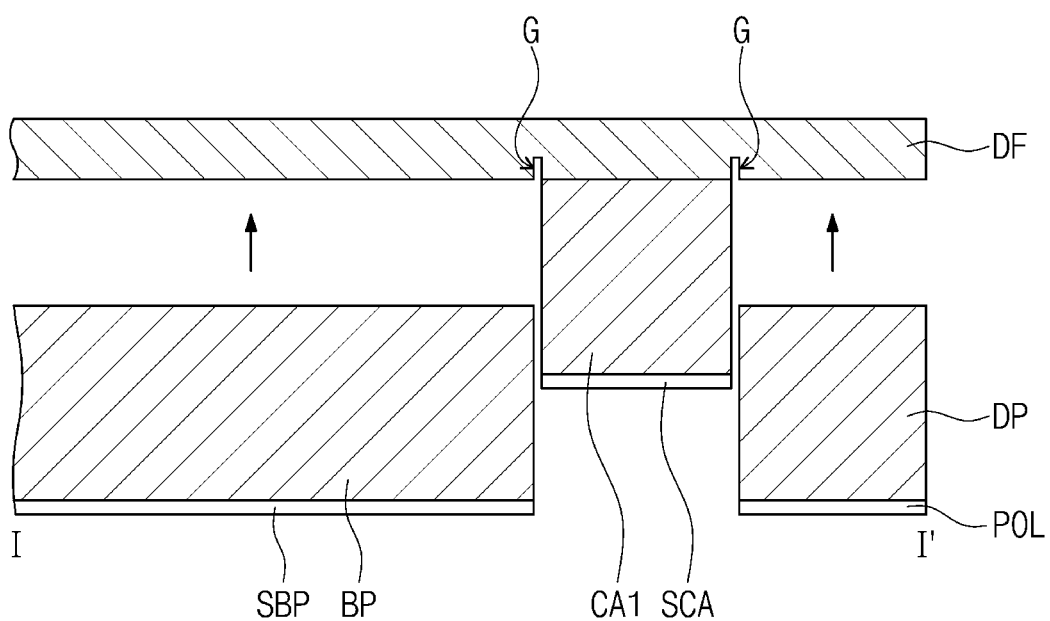

Referring to FIG. 8, the dummy film DF may be separated upwards from the body part BP of the display panel DP. The first cutting area CA1 is attached to the dummy film DF, and the first cutting area CA1 and the sub cutting area SCA are respectively cut from the body part BP and the sub body unit SBP. Accordingly, when the dummy film is separated from the body part BP, the first cutting area CA1 and the sub cutting area SCA may be respectively separated upwards from the body part BP and the sub body unit SBP along the dummy film DF.

Figure 9:
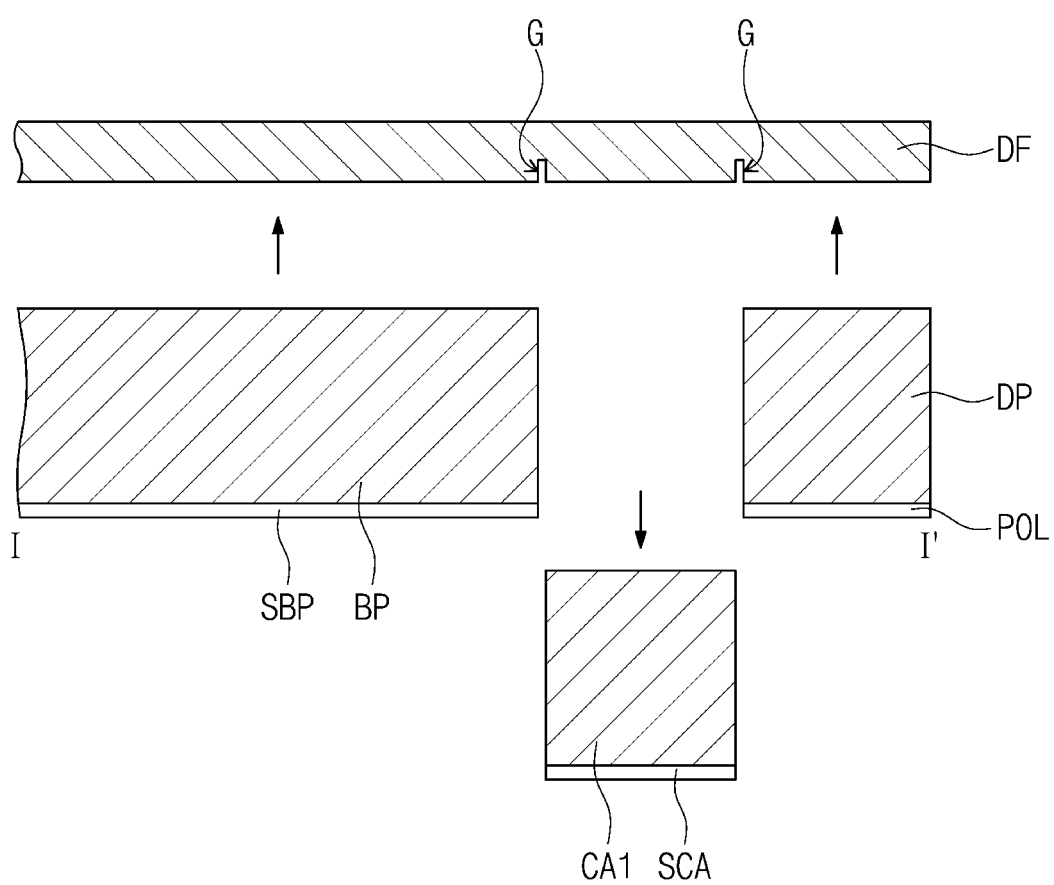

Referring to FIG. 9, the first cutting area CA1 attached to the dummy film DF may be separated from the dummy film DF. Accordingly, the first cutting area CA1 and the sub cutting area SCA may be separated from the dummy film DF and discarded.

The process shown in FIG. 9 may be omitted. For example, as shown in FIG. 8, the first cutting area CA1 and the sub cutting area SCA may not be separated from the dummy film DF, but be discarded with the dummy film DF.

When the dummy film DF is not attached to the display panel DP, the opening part OP may be positioned under the first cutting area CA1. When the laser light LAR is moved from the starting point along the first cutting line CL1, a part of the first cutting area CA1, which is cut earlier, may exist. Because under the first cutting area CA1 is a vacant space, the part of the first cutting area CA1, which has been cut earlier, may sag due to the gravity. In this case, the first cutting area CA1 may not be accurately cut.

In an embodiment of the inventive concept, the first cutting area CA1 is cut in a state where the dummy film DF supports the first cutting area CA1, and then the dummy film DF is removed. Therefore, the first cutting area CA1 may be more accurately cut. The second and third cutting areas CA2 and CA3 may be also cut more accurately in the processes shown in FIGS. 4 to 9.

Consequently, according to the method for manufacturing the display device according to some example embodiments of the inventive concept, the cutting areas CA1, CA2, and CA3 may be more accurately cut to improve a yield ratio of the display device.

Figure 10:
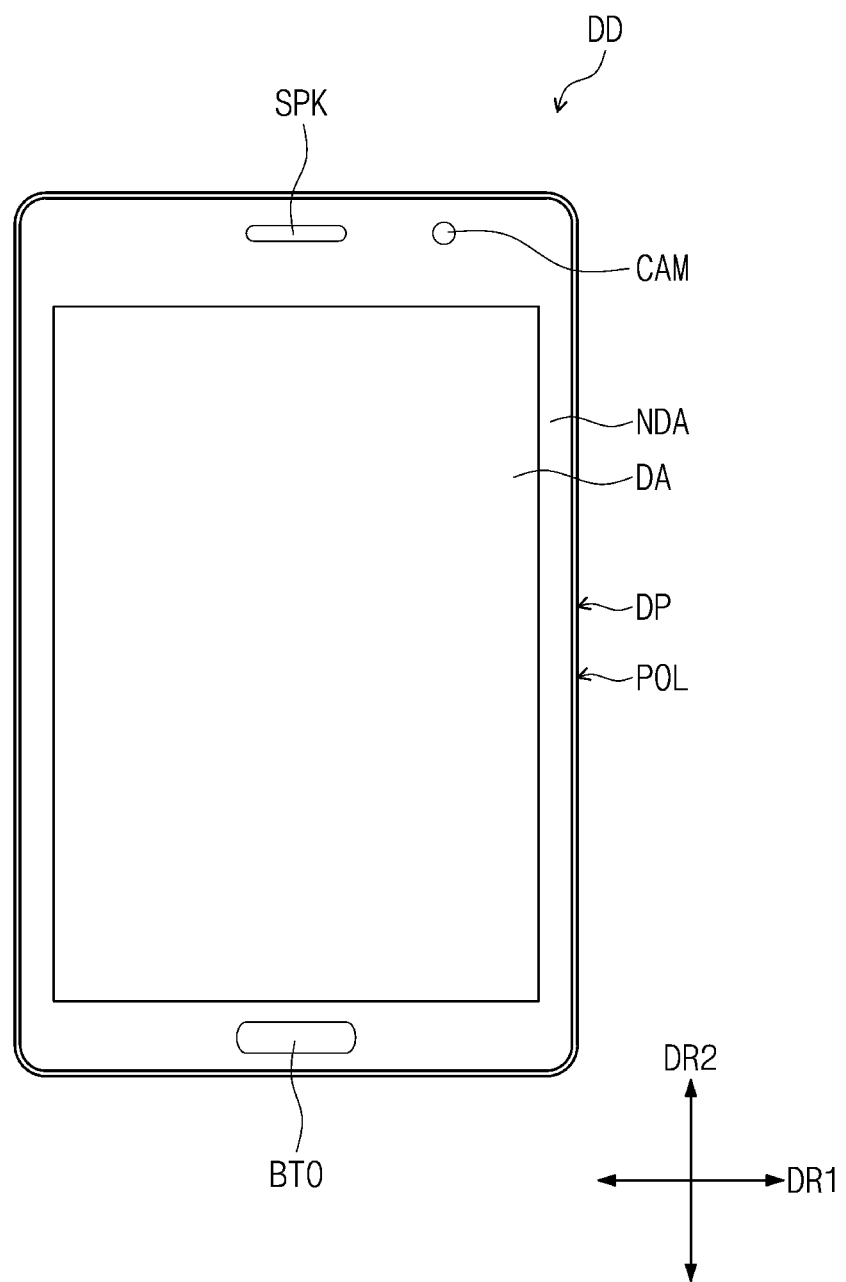

Referring to FIG. 10, the laser light may be irradiated to the first, second and third cutting lines CL1, CL2, and CL3, and the first, second and third cutting areas CA1, CA2, and CA3 may be cut. Then the first, second, and third cutting areas CA1, CA2, and CA3 are removed to define first, second and third holes H1, H2, and H3 in the display panel DP.

Although shown as a plan view, the polarization film POL may be substantially positioned on the display panel DP. The sub cutting areas of the polarization film POL, which correspond to the first, second and third cutting areas CA1, CA2, and CA3, are removed to define the first, second and third holes H1, H2, and H3.

In the first hole H1 defined by removing the first cutting area CA1, a camera CAM may be positioned. In the second hole H2 defined by removing the second cutting area CA2, a speaker SPK may be positioned. In the third hole H3 defined by removing the third cutting area CA3, a functional button BTO may be positioned. Accordingly, a display device DD in which the camera CAM, the speaker SPK, and the functional button BTO are positioned may be manufactured.

FIGS. 11 to 15 are drawings for illustrating a method for manufacturing a display device according to another embodiment of the inventive concept.

Except for the position of the dummy film DF, the method for manufacturing a display device shown in FIGS. 11 to 15 is substantially the same as that shown in FIGS. 4 to 10. Accordingly, hereinafter, the method for manufacturing a display device shown in FIGS. 11 to 15 will be described mainly about different processes from that shown in FIGS. 4 to 10. In addition, identical configurations are illustrated using identical marks.

Figure 11:
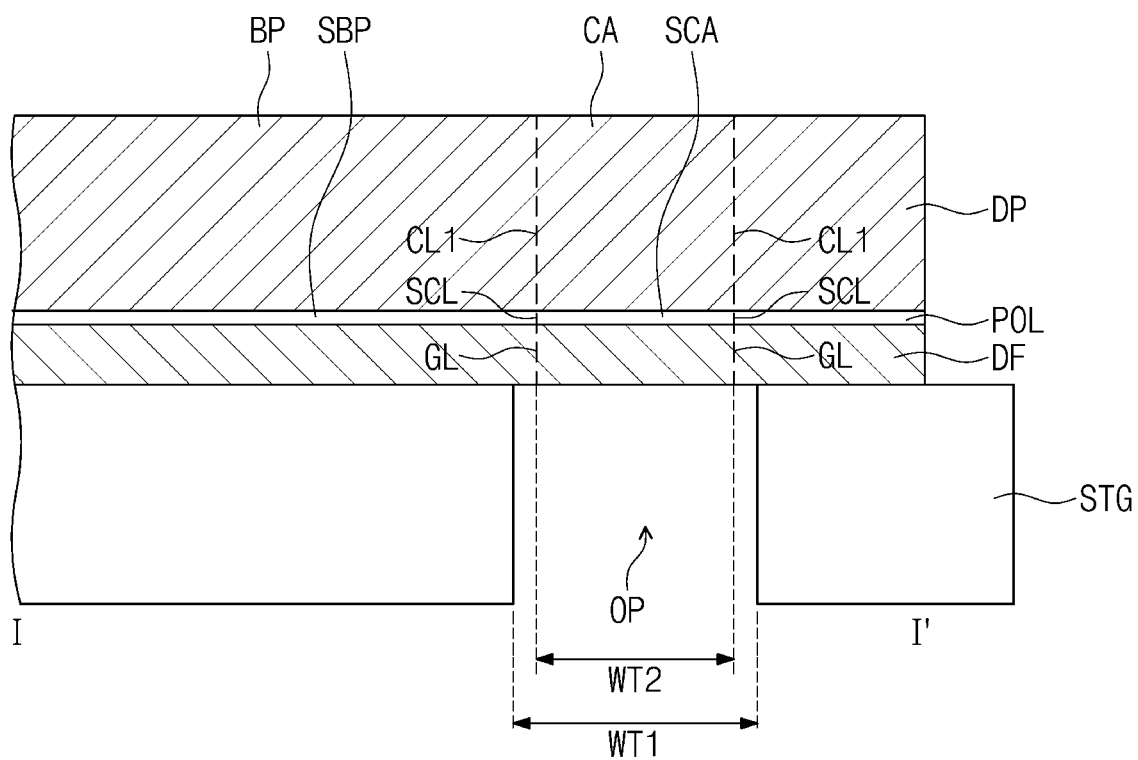
FIGS. 11 to 15 are drawings for illustrating a method for manufacturing a display device according to some example embodiments of the inventive concept.

Referring to FIG. 11, a polarization film POL is positioned under a display panel DP, and a dummy film DF may be attached to the bottom surface of the polarization film POL. The display panel DP, the polarization film POL and the dummy film DF may be positioned on the stage STG, and the dummy film DF may be safely positioned on the stage STG.

The display panel DP, the polarization film POL and the dummy film DF, and the stage STG may have the same structures as those shown in FIG. 5.

Figure 12:
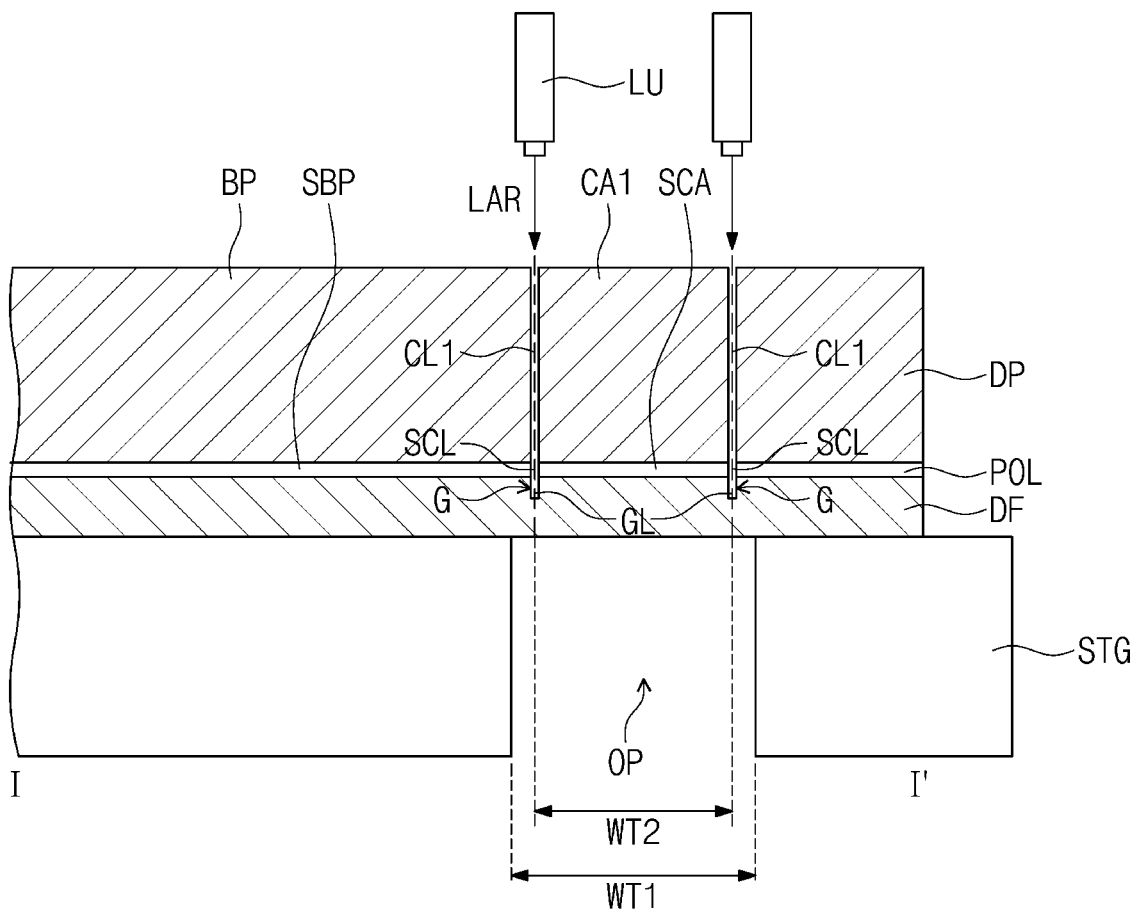

Referring to FIG. 12, laser light LAR may be irradiated towards a first cutting line CL1 and a sub cutting line SCL from above the display panel DP. The laser light LAR may be irradiated along the first cutting line CL1 and the sub cutting line SCL to cut a first cutting area CA1 and a sub cutting area SCA.

After the first cutting area CA1 and the sub cutting area SCA are cut, the laser light LAR may be irradiated to a groove line GL of the dummy film DF. The laser light LAR may be irradiated along the groove ling GL to define a groove G in the dummy film DF along the groove line GL.

Figure 13:
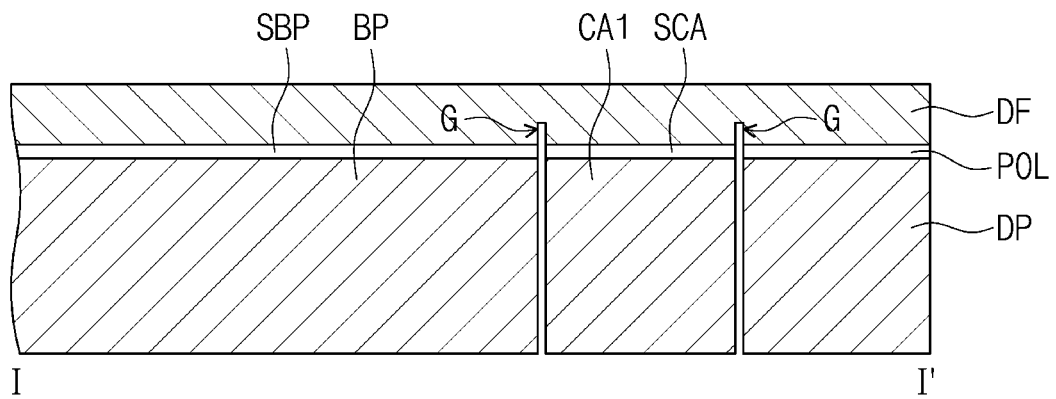

Referring to FIG. 13, after the dummy film DF safely positioned on the state STG is separated from the stage STG, the display panel DP, the polarization film POL and the dummy film DF may be reversed. The polarization film POL may be positioned under the dummy film DF and the display panel DP may be positioned under the polarization film POL.

Figure 14:
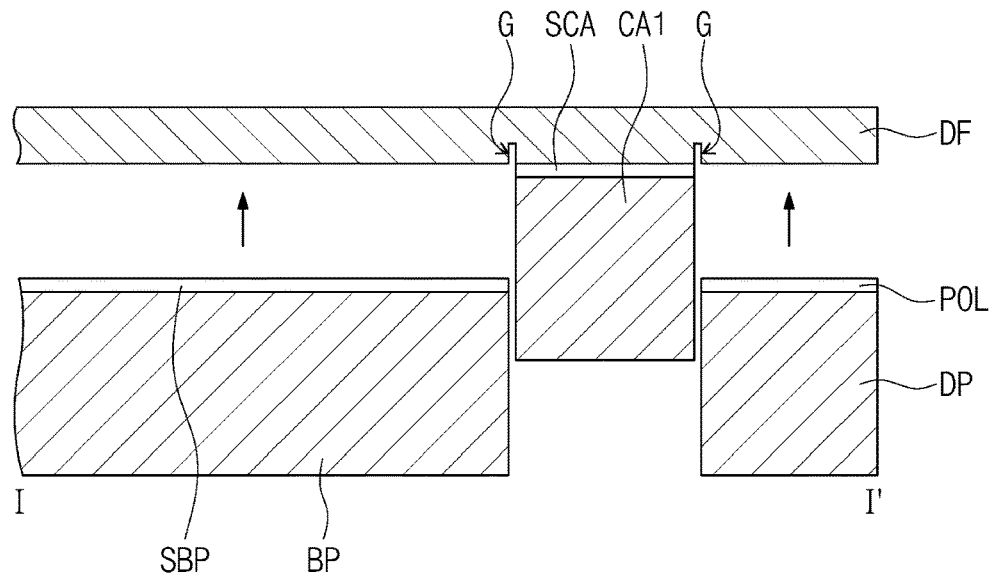

Referring to FIG. 14, the dummy film DF may be separated upwards from the sub body part SBP of the polarization film POL. The sub cutting area SCA is attached to the dummy film DF, and the sub cutting area SCA and the first cutting area CA1 are respectively cut from the sub body part SBP and the body part BP. Accordingly, when the dummy film DF is separated from the sub body part SBP, the sub cutting area SCA and the first cutting area CA1 may be separated upwards from the body part BP and the sub body unit SBP along the dummy film DF.

Figure 15:
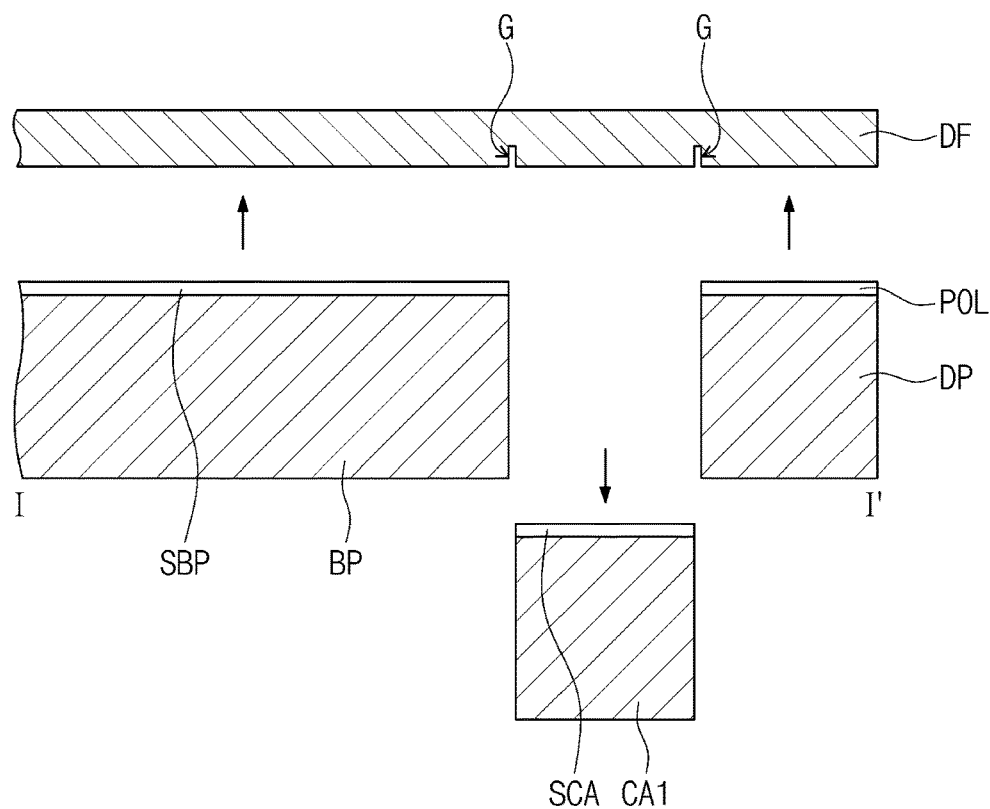

Referring to FIG. 15, the sub cutting area SCA attached to the dummy film DF may be separated from the dummy film DF. Accordingly, the sub cutting area SCA and the first cutting area CA1 may be separated from the dummy film DF and discarded.

The process shown in FIG. 15 may be omitted. For example, as shown in FIG. 14, the sub cutting area SCA and the first cutting area CA1 may not be separated from the dummy film DF, but be discarded with the dummy film DF.

According to some example embodiments, as shown in FIG. 10, the functional elements may be positioned in the first, second, and third holes H1, H2, and H3 defined in the polarized film POL.

Figure 16:
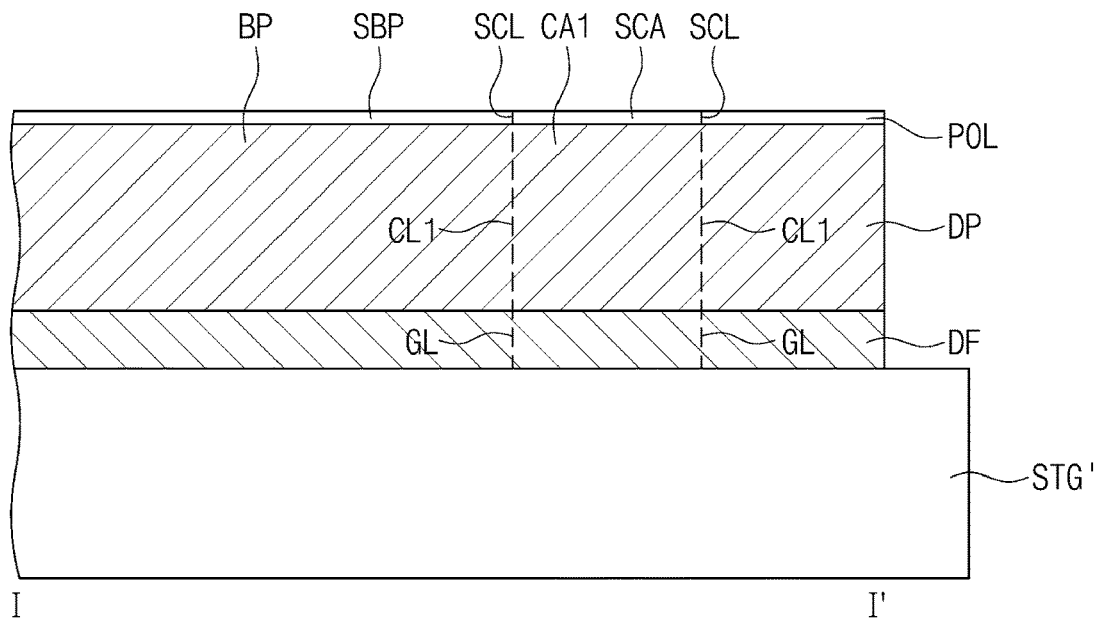
FIGS. 16 and 17 are drawings for explaining a method for manufacturing a display device according to some example embodiments of the inventive concept.
Figure 17:
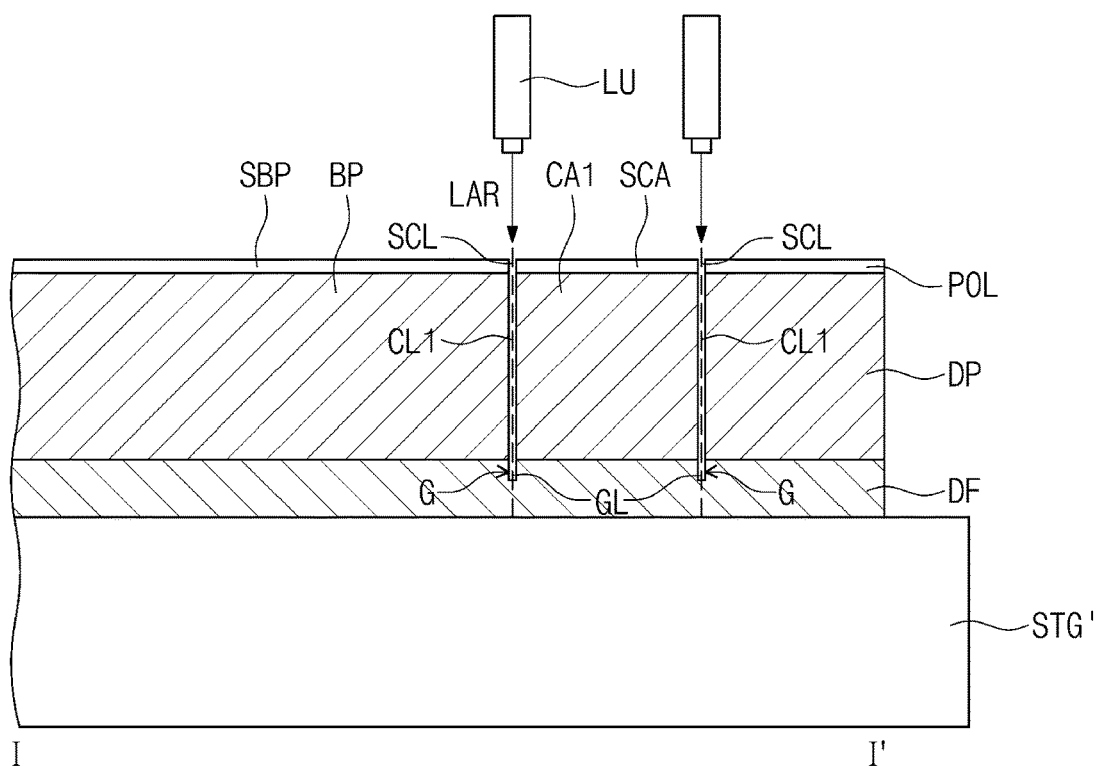

FIGS. 16 and 17 are drawings for explaining a method for manufacturing a display device according to some example embodiments of the inventive concept.

Except for a configuration of a stage STG, the method for manufacturing a display device shown in FIGS. 16 to 17 is substantially the same as that shown in FIGS. 4 to 10. Hereinafter, the configuration of the stage STG will be mainly described, and identical configurations are denoted with identical marks.

Referring to FIG. 16, unlike the stage STG shown in FIG. 5, in a stage STG', the opening part OP may not be defined. Accordingly, the state STG may support the first cutting area CA1 and the body part BP.

Positions and structures of a display panel DP, a dummy film DF, and a polarization film POL may be the same as those of the display panel DP, the dummy film DF, and the polarization film POL shown in FIG. 5.

Referring to FIG. 17, similar to the process shown in FIG. 6, laser light LAR is irradiated to cut a first cutting area CA1 and a sub cutting area SCA, and a groove G may be defined in a dummy film DF along a groove line GL. Subsequent processes are substantially the same as those shown in FIGS. 7 to 10, and thus descriptions thereabout will be omitted.

According to some example embodiments of the inventive concept, as shown in FIGS. 5 and 6, an opening part OP may be defined in the stage STG, or as shown in FIGS. 16 and 17, the opening part OP may not be defined in the stage STG. That is because damage to a bottom part of the display panel DP may be prevented or reduced by the laser light regardless of presence or absence of the opening part OP as described in more detail below.

The dummy film DF is not attached to the bottom part of the display panel DP, the opening part OP is not defined in the state STG, and the display panel DP may be directly safely positioned in the stage STG. Because the opening part OP is not defined in the stage STG, the laser light LAR may reach the stage STG after cutting the first cutting area CA1. In this case, the laser light LAR may be reflected by the stage STG to damage the bottom part of the display panel DP.

However, as shown in FIGS. 16 and 17, because the dummy film DF is positioned under the display panel DP, the laser light LAR may define the groove G in a prescribed part of the dummy film DF, but not reach the stage STG. Even when the laser light LAR cuts the dummy film DF to reach the stage STG, the laser light LAR reflected by the stage STG may be irradiated to the dummy film DF, but not to the bottom part of the display panel DP. In other words, the dummy film DF may play a role of a protection film, and protect the bottom part of the display panel DP from being damaged.

As shown in FIGS. 5 and 6, when the opening part OP is defined in the stage STG, even though the laser light LAR cuts the dummy film DF, the laser light LAR passes through the opening part OP. And thus the laser light LAR may be not provided to the bottom part of the display panel DP. In other words, in order to prevent reflection by the stage STG, the opening part OP may be defined in a portion of the stage STG, which is positioned under the first cutting area CA1.

However, as described above, because the dummy film DF may protect the display panel DP from the laser light LAR reflected by the stage STG, the opening part OP may not be defined in the stage STG.

A method for manufacturing a display device according to some example embodiments of the inventive concept includes a process of positioning a dummy film configured to support a cutting area in a bottom part of a display panel, cutting the cutting area, and then removing the dummy film.

Accordingly, the cutting area may be cut more accurately to improve a yield ratio of the display device.

Although aspects of some example embodiments of the present invention have been described, it is understood that the present invention should not be limited to these example embodiments but various changes and modifications can be made by one ordinary skilled in the art within the spirit and scope of the present invention as hereinafter claimed. In addition, embodiments disclosed in the inventive concept are not intended to limit the technical spirit of the inventive concept, and the protection scope of the present invention should be interpreted based on the following appended claims and it should be appreciated that all technical spirits included within a range equivalent thereto are included in the protection scope of the present invention.

What is claimed is:

1. A method for manufacturing a display device, the method comprising:
   providing a display panel divided into a cutting area and a body part surrounding the cutting area;
   attaching a dummy film on a bottom surface of the display panel;
   cutting the cutting area by irradiating laser light toward a cutting line defined as a boundary between the cutting area and the body part;
   irradiating the laser light to a groove line of the dummy film, which overlaps the cutting line, to define a groove in the dummy film along the groove line; and
   separating the dummy film from the body part.

2. The method of claim 1, further comprising:
   separating the cutting area from the dummy film.

3. The method of claim 1, wherein the cutting area is not separated from the dummy film.

4. The method of claim 1, wherein the display panel comprises:
   a substrate;
   a pixel layer on the substrate and comprising a plurality of pixels; and
   a protection substrate under the substrate,
   wherein the dummy film is attached to a bottom surface of the protection substrate.

5. The method of claim 1, wherein a plane area of the display panel comprises:
   a display area; and
   a non-display area surrounding the display area,
   wherein the cutting area is in the non-display area.

6. The method of claim 1, wherein the dummy film is attached to the bottom surface of the display panel through a pressure sensitive adhesive.

7. The method of claim 1, wherein the dummy film comprises polyimide or polyethylene terephthalate.

8. The method of claim 1, wherein the cutting area is defined as a single closed curve.

9. The method of claim 1, wherein the separating comprises:
   reversing the display panel and the dummy film to position the display panel under the dummy film; and
   separating the dummy film upwards from the body part.

10. The method of claim 1, further comprising:
    positioning a polarization film divided into a sub cutting area and a sub body part surrounding the sub cutting area on the display panel; and
    irradiating, above the polarization film, the laser light toward the sub cutting line defined as a boundary between the sub cutting area and the sub body part to cut the sub cutting area,
    wherein the sub cutting line overlaps the cutting line.

11. The method of claim 1, further comprising:
    positioning the dummy film and the display panel on a stage before the cutting the cutting area,
    wherein the dummy film is positioned on the stage.

12. The method of claim 11, wherein the stage does not support the cutting area, but supports the body part.

13. The method of claim 12, where an opening part overlapping the cutting area is defined in the stage, and the opening part has a width greater than the cutting area.

14. The method of claim 11, wherein the stage supports the cutting area and the body part.

15. A method for manufacturing a display device, the method comprising:
    providing a display panel divided into a cutting area and a body part surrounding the cutting area;
    positioning a polarization film divided into a sub cutting area overlapping the cutting area and a sub body part surrounding the sub cutting area under the display panel;
    attaching a dummy film on a bottom surface of the polarization film;
    cutting the cutting area and the sub cutting area by irradiating, above the display panel, laser light toward a cutting line defined as a boundary between the cutting area and the body part;
    irradiating the laser light to a groove line of the dummy film, which overlaps the cutting line, to define a groove in the dummy film along the groove line; and
    separating the dummy film from the sub body part.

16. The method of claim 15, further comprising separating the sub cutting area from the dummy film.

17. The method of claim 15, wherein the sub cutting area is not separated from the dummy film.

18. The method of claim 15, further comprising:
    positioning the display panel, the polarization film, and the dummy film on a stage before cutting the cutting area and the sub cutting area, wherein the dummy film is positioned on the stage.

19. The method of claim 18, wherein an opening part overlapping the cutting area is defined in a stage, and the opening part has a width greater than the cutting area.

20. The method of claim 18, wherein the separating comprises:
    reversing the display panel, the polarization film, and the dummy film;
    positioning the polarization film under the dummy film;
    positioning the display panel under the polarization film; and
    separating the dummy film upwards from the sub body part.

* * * * *